United States Patent
Shin et al.

(10) Patent No.: US 7,910,967 B2
(45) Date of Patent: Mar. 22, 2011

(54) FERROELECTRIC CAPACITOR HAVING THREE-DIMENSIONAL STRUCTURE, NONVOLATILE MEMORY DEVICE HAVING THE SAME AND METHOD OF FABRICATING THE SAME

(75) Inventors: Sang-min Shin, Seoul (KR); Young-soo Park, Suwon-si (KR); June-mo Koo, Seoul (KR); Byoung-jae Bae, Hwaseong-si (KR); I-hun Song, Seongnam-si (KR); Suk-pil Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 94 days.

(21) Appl. No.: 11/515,024

(22) Filed: Sep. 5, 2006

(65) Prior Publication Data

US 2007/0051999 A1 Mar. 8, 2007

(30) Foreign Application Priority Data

Sep. 5, 2005 (KR) .................. 10-2005-0082439

(51) Int. Cl.
  *H01L 21/00* (2006.01)
  *H01L 31/112* (2006.01)
  *H01L 23/48* (2006.01)
(52) U.S. Cl. ........... 257/295; 438/3; 257/751; 257/767; 257/E29.164; 257/E27.104; 257/E21.663; 257/E21.664
(58) Field of Classification Search .............. 438/3, 627, 438/643, 653; 257/295, E27.104, E29.164, 257/E21.663, E21.664
See application file for complete search history.

(56) References Cited

U.S. PATENT DOCUMENTS

| | | | | |
|---|---|---|---|---|
| 6,284,595 | B1 * | 9/2001 | Kato | 438/253 |
| 6,642,539 | B2 * | 11/2003 | Ramesh et al. | 257/43 |
| 6,682,969 | B1 * | 1/2004 | Basceri et al. | 438/240 |
| 7,161,793 | B2 * | 1/2007 | Kurihara et al. | 361/306.3 |
| 2002/0000598 | A1 * | 1/2002 | Kang et al. | 257/301 |
| 2005/0167725 | A1 * | 8/2005 | Nagano et al. | 257/309 |
| 2005/0205910 | A1 * | 9/2005 | Kumura et al. | 257/295 |
| 2006/0054948 | A1 * | 3/2006 | Yamada | 257/295 |
| 2006/0134808 | A1 * | 6/2006 | Summerfelt et al. | 438/3 |

FOREIGN PATENT DOCUMENTS

KR 1020000048374 A 7/2000

OTHER PUBLICATIONS

Korean Office Action dated Sep. 28, 2006.

* cited by examiner

*Primary Examiner* — Hsien-ming Lee
*Assistant Examiner* — Kevin Parendo
(74) *Attorney, Agent, or Firm* — Harness, Dickey & Pierce, P.L.C.

(57) ABSTRACT

A ferroelectric capacitor having a three-dimensional structure, a nonvolatile memory device having the same, and a method of fabricating the same are provided. The ferroelectric capacitor may include a trench-type lower electrode, at least one layer formed around the lower electrode, a ferroelectric layer (PZT layer) formed on the lower electrode and the at least one layer and an upper electrode formed on the ferroelectric layer. The at least one layer may be at least one insulating interlayer and the at least one layer may also be at least one diffusion barrier layer. The at least one layer may be formed of an insulating material excluding $SiO_2$ or may have a perovskite crystal structure excluding Pb.

26 Claims, 9 Drawing Sheets

FERROELECTRIC CAPACITOR HAVING THREE-DIMENSIONAL STRUCTURE, NONVOLATILE MEMORY DEVICE HAVING THE SAME AND METHOD OF FABRICATING THE SAME

PRIORITY STATEMENT

This application claims priority under 35 U.S.C. §119 to Korean Patent Application No. 10-2005-0082439, filed on Sep. 5, 2005, in the Korean Intellectual Property Office (KIPO), the entire contents of which are incorporated herein by reference.

BACKGROUND

1. Field

Example embodiments relate to a ferroelectric capacitor having a three-dimensional structure, a nonvolatile memory device having the same, and a method of fabricating the same.

2. Description of the Related Art

A problem with the fabrication of semiconductor devices may be a side-effect caused by a mutual diffusion of materials. The mutual diffusion of materials may result from the interface characteristics of component materials used in forming a semiconductor device and/or a higher processing temperature in the fabrication of semiconductor devices.

Conventional semiconductor memory devices are being developed (e.g., a ferroelectric random access memory (FRAM) semiconductor memory device, magnetic random access memory (MRAM) and/or a phase change random access memory (PRAM)). There have been efforts to modify the structure of a ferroelectric capacitor in a FRAM into various shapes and structures in order to achieve relatively high integration of the device. During the processing of a conventional ferroelectric capacitor, a concentration of Pb in a PZT layer may be reduced due to a mutual diffusion of Pb of the PZT layer and Si in a layer under the PZT layer.

When the concentration of Pb in the PZT layer is reduced, a crystal structure of the PZT layer may be changed from a perovskite structure to a pyrochlore structure. If the crystal structure is changed, the PZT layer may not have normal polarization characteristics and may not be beneficial as a ferroelectric. Even though the change in the crystal structure is confined to a local region of the PZT layer, the region of the PZT usable as a ferroelectric may be reduced and an effective area of the ferroelectric capacitor may be reduced.

SUMMARY

Example embodiments provide a ferroelectric capacitor capable of reducing mutual diffusion of Pb and Si. Other example embodiments provide a nonvolatile memory device having the ferroelectric capacitor and a method of fabricating the nonvolatile memory device.

According to example embodiments, a ferroelectric capacitor may include a lower electrode, an insulating interlayer around the lower electrode, a ferroelectric layer formed on the lower electrode and the insulating interlayer and an upper electrode on the ferroelectric layer, wherein at least one diffusion barrier layer is formed between the insulating interlayer and the ferroelectric layer. The lower electrode may extend between the femmelectric layer and the at least one diffusion barrier layer at a desired length. The insulating interlayer may be a stack structure including an insulating interlayer and at least one diffusion barrier layer. The at least one diffusion barrier layer may be composed of an insulating material excluding $SiO_2$, for example, a SiN layer, a $TiO_2$ layer, a SiON layer and/or an $Al_2O_3$ layer. The at least one diffusion barrier layer may also have a perovskite crystal structure excluding Pb. The at least one diffusion barrier layer may include two diffusion barrier layers. The first diffusion barrier layer may be one selected from the group including a SiN layer, a $TiO_2$ layer, a SiON layer, and an $Al_2O_3$ layer. The second diffusion barrier layer may have a perovskite crystal structure excluding Pb. The second diffusion barrier layer may be a BST layer or a $LiNbO_3$ layer. The lower electrode may be a trench structure and the ferroelectric layer may be a PZT layer.

According to other example embodiments, a nonvolatile memory device may include a switching element on a substrate, the ferroelectric capacitor according to example embodiments and a connecting element connecting the switching element and the ferroelectric capacitor via the lower electrode. The nonvolatile memory device may also include an insulating interlayer covering the switching element, a contact hole exposing the switching element and a conductive plug filling the contact hole. The nonvolatile memory device may include an ohmic contact layer covering the insulating interlayer. The ohmic contact layer may cover the conductive plug and may extend onto the insulating interlayer.

According to example embodiments, a ferroelectric capacitor may include a lower electrode, an insulating interlayer around the lower electrode, a ferroelectric layer formed on the lower electrode and the insulating interlayer and an upper electrode on the ferroelectric layer, wherein at least one diffusion barrier layer is formed between the insulating interlayer and the ferroelectric layer. The lower electrode may extend between the femmelectric layer and the at least one diffusion barrier layer at a desired length. The insulating interlayer may be a stack structure including an insulating interlayer and at least one diffusion barrier layer. The at least one diffusion barrier layer may be composed of an insulating material excluding $SiO_2$, for example, a SiN layer, a $TiO_2$ layer, a SiON layer and/or an $Al_2O_3$ layer. The at least one diffusion barrier layer may also have a perovskite crystal structure excluding Pb. The at least one diffusion barrier layer may include two diffusion barrier layers. The first diffusion barrier layer may be one selected from the group including a SiN layer, a $TiO_2$ layer, a SiON layer, and an $Al_2O_3$ layer. The second diffusion barrier layer may have a perovskite crystal structure excluding Pb. The second diffusion barrier layer may be a barium strontium titanate (BST) layer or a $LiNbO_3$ layer. The lower electrode may be a trench structure and the ferroelectric layer may be a PZT layer.

According to other example embodiments, a method of fabricating a nonvolatile memory device may include forming a switching element on a substrate, forming a ferroelectric capacitor according to example embodiments and forming a connecting element connecting the switching element and the ferroelectric capacitor via the lower electrode. The method may further include forming an insulating interlayer to cover the switching element on the substrate, forming a contact hole exposing a drain region of the switching element in the insulating interlayer and filling the contact hole with a conductive plug on the insulating interlayer.

Forming the lower electrode may further include forming the lower electrode covering the side surface and the bottom surface of the via hole on the at least one diffusion barrier layer and polishing the lower electrode until the at least one diffusion barrier layer is exposed. An ohmic contact layer covering the conductive plug may be further formed between a first insulating interlayer and a second insulating interlayer layer, and the via hole may be formed to expose the ohmic contact layer. The ohmic contact layer may be further formed between the conductive plug and the lower electrode.

BRIEF DESCRIPTION OF THE DRAWINGS

Example embodiments will be more clearly understood from the following detailed description taken in conjunction with the accompanying drawings. FIGS. 1-14 represent non-limiting, example embodiments as described herein.

DETAILED DESCRIPTION OF EXAMPLE EMBODIMENTS

Example embodiments will now be described more fully hereinafter with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. In the drawings, the thicknesses of layers or regions are exaggerated for clarity.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90° or at other orientations) and the spatially relative descriptors used herein interpreted accordingly.

The terminology used herein is for the purpose of describing particular embodiments only and is not intended to be limiting of example embodiments. As used herein, the singular forms "a", "an" and "the" are intended to include the plural forms as well, unless the context clearly indicates otherwise.

It will be further understood that the terms "comprises", "comprising,", "includes" and/or "including", when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
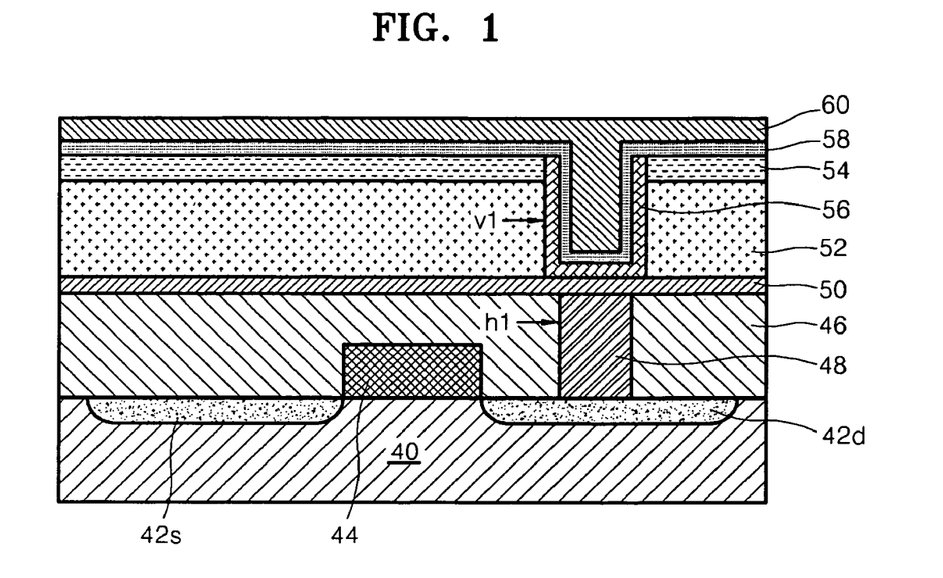
FIGS. 1-4 are diagrams illustrating a nonvolatile memory device according to example embodiments.
Figure 4:
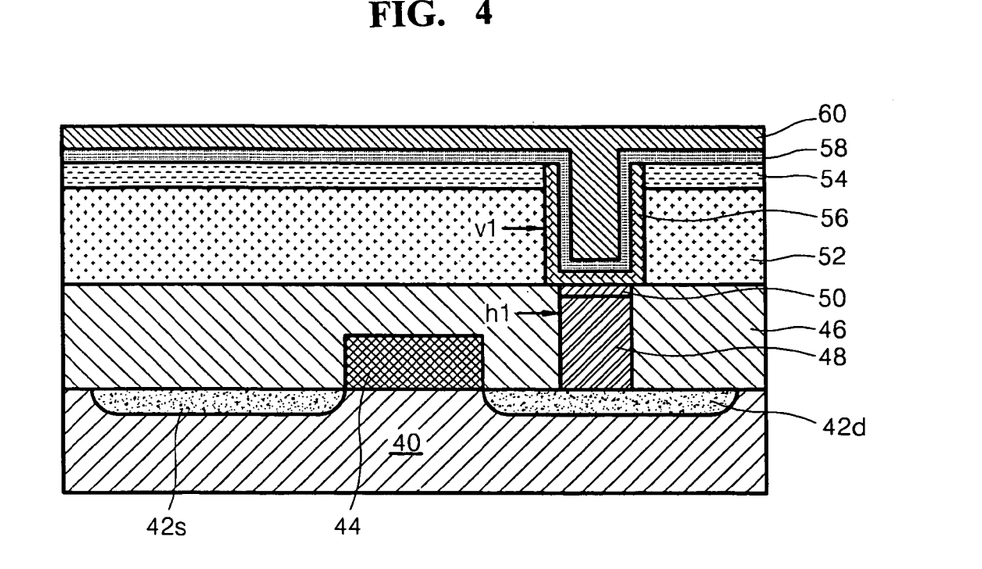

FIG. 1 is a diagram illustrating a nonvolatile memory device according to example embodiments. Referring to FIG. 1, first and second impurity regions 42s and 42d may be formed in a substrate 40 with a given depth from a surface of the substrate 40. The first and second impurity regions 42s and 42d may be doped with impurities having a polarity opposite to that of the impurities doping the substrate 40 and may be spaced apart. One of the first and second impurity regions 42s and 42d may be a source region and the other one may be a drain region. A gate stack 44 may be formed on the substrate 40 between the first and second impurity regions 42s and 42d. The gate stack 44 may include a gate oxide layer, a gate electrode and/or a spacer. The first and second impurity regions 42s and 42d and the gate stack 44 may constitute a field effect transistor (not shown) as part of a switching element. A first insulating interlayer 46 covering the field effect transistor may be disposed on the substrate 40. A contact hole h1 exposing the second impurity region 42d may be formed in the first insulating interlayer 46. The contact hole h1 may be filled with a conductive plug 48. An ohmic contact layer 50 covering an upper surface of the conductive plug 48 may be formed on the first insulating interlayer 46. The ohmic contact layer 50 may be formed only on the upper surface of the conductive plug 48 as illustrated in FIG. 4. The ohmic contact layer 50 may be, for example, a TiAlN layer. A relatively thick second insulating interlayer 52 may be disposed on the ohmic contact layer 50. A second insulating interlayer 52 may be, for example, a silicon dioxide ($SiO_2$) layer.

A diffusion barrier layer 54 may be formed on an upper surface of the second insulating interlayer 52. The diffusion barrier layer 54 may be an insulating layer excluding $SiO_2$, for example, a nitride (SiN) layer, a titanium oxide ($TiO_2$) layer, a silicon oxynitride (SiON) layer and/or an aluminum oxide ($Al_2O_3$) layer. A via hole v1 exposing the ohmic contact layer 50 may be formed in a stack structure including the second insulating interlayer 52 and the diffusion barrier layer 54. A side surface and a bottom of the via hole v1 may be covered with a lower electrode 56. The lower electrode 56 may be composed of a noble metal, for example, iridium (Ir). An inner surface of the lower electrode 56 may be covered with a PZT layer 58 with a given thickness. The PZT layer 58 may extend onto the diffusion barrier layer 54. A ferroelectric layer other than the PZT layer 58 may be used instead of the PZT layer 58. An upper electrode 60 may be formed on the PZT layer 58 to cover the via hole v1. The upper electrode 60 may be composed of the same noble metal as that of the lower electrode 56, for example, iridium (Ir), but may also be a noble metal different from that of the lower electrode 56. The lower electrode 56, the PZT layer 58, and the upper electrode 60 may constitute a ferroelectric capacitor.

Figure 2:
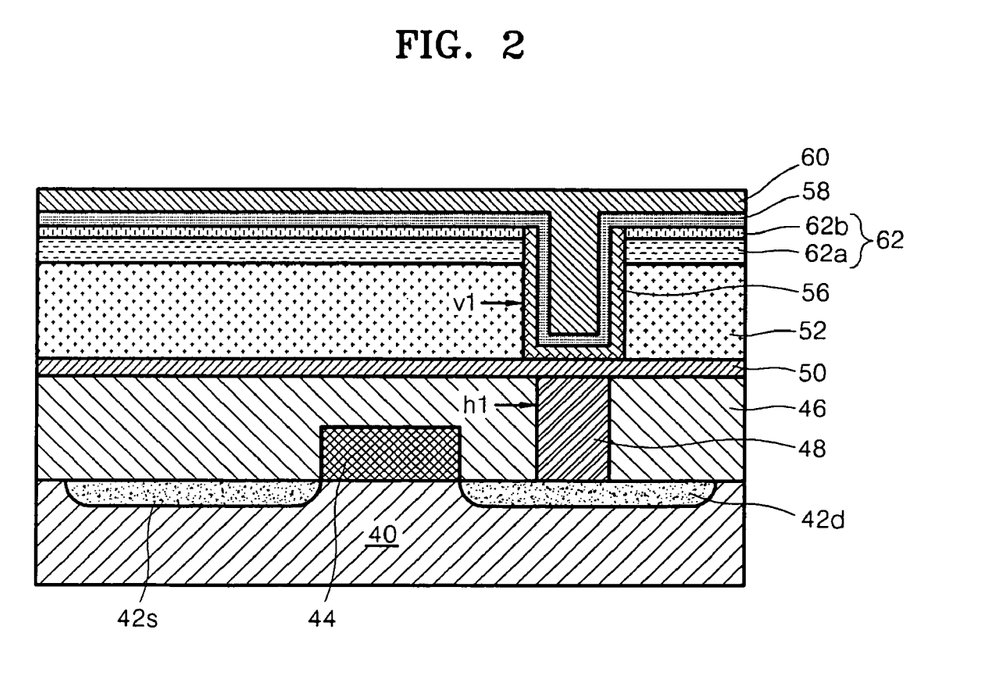

The via hole v1 formed in the stack structure, including the second insulating interlayer 52 and the diffusion barrier layer 54, may be a trench in view of a stack structure including the first and second insulating interlayers 46 and 52. The ferroelectric capacitor formed in the via hole v1 may have a trench structure. The memory device, according to other example embodiments, may have a double layer including a diffusion barrier layer 62 between an insulating interlayer 52 and a PZT layer 58 as illustrated in FIG. 2. The double layer, including the diffusion barrier layer 62, may include first and second diffusion barrier layers 62a and 62b, which are sequentially stacked. The second diffusion barrier layer 62b may be a ferroelectric layer having the same crystal structure (e.g., perovskite structure) as that of the PZT layer 58, and not including Pb, for example, a BST layer and/or a LiNbO$_3$ layer.

Figure 3:
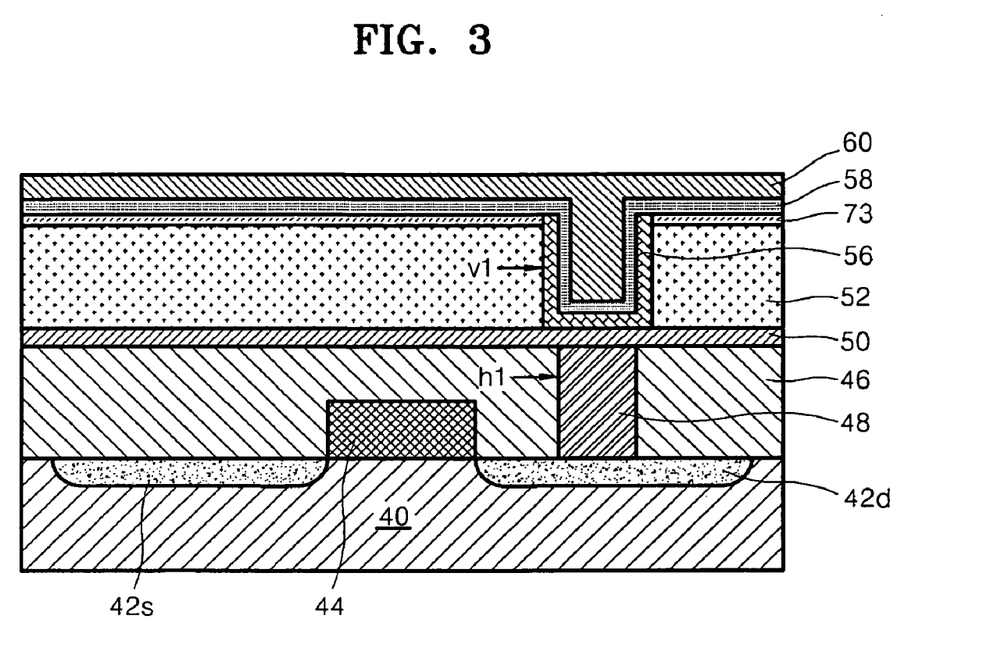

As illustrated in FIG. 3, a diffusion barrier layer 73 may be a single layer. As illustrated in FIG. 4, an ohmic contact layer 50 may be formed on an upper surface of a conductive plug 48. The structure of the ohmic contact layer 50 may also be employed to other example embodiments. An effect of the presence of the diffusion barrier layer 54 may be achieved by secondary ion mass spectroscopy (SIMS) analysis. In SIMS analysis, the stack structure having the second insulating interlayer 52, the diffusion barrier layer 54, and the PZT layer 58 may be removed sequentially from the upper surface of the PZT layer 58 to the lower surface of the second insulating interlayer 52 by a given thickness each time. The SIMS analysis may be performed using a sputtering method, and then, mass spectroscopy may be performed on removed portions sequentially.

Figure 5:
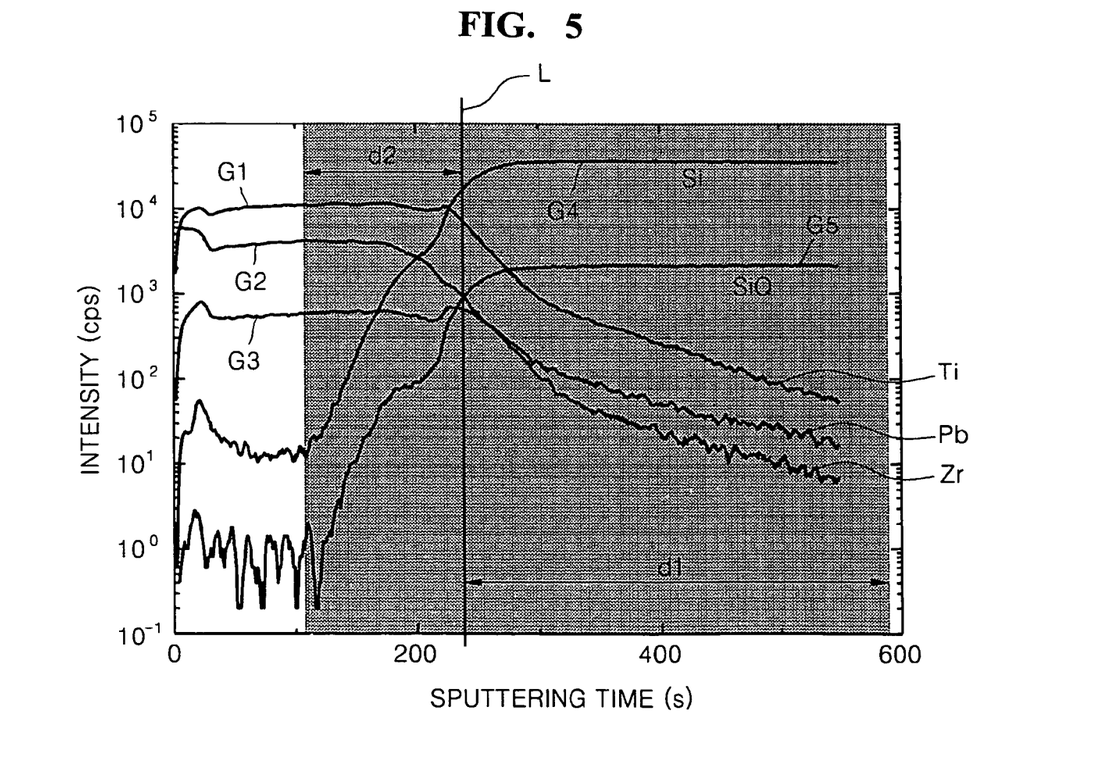
FIG. 5 is a graph illustrating SIMS data to examine a mutual diffusion extent of Pb and Si when a diffusion barrier layer is not provided in a nonvolatile memory device according to example embodiments.
Figure 6:
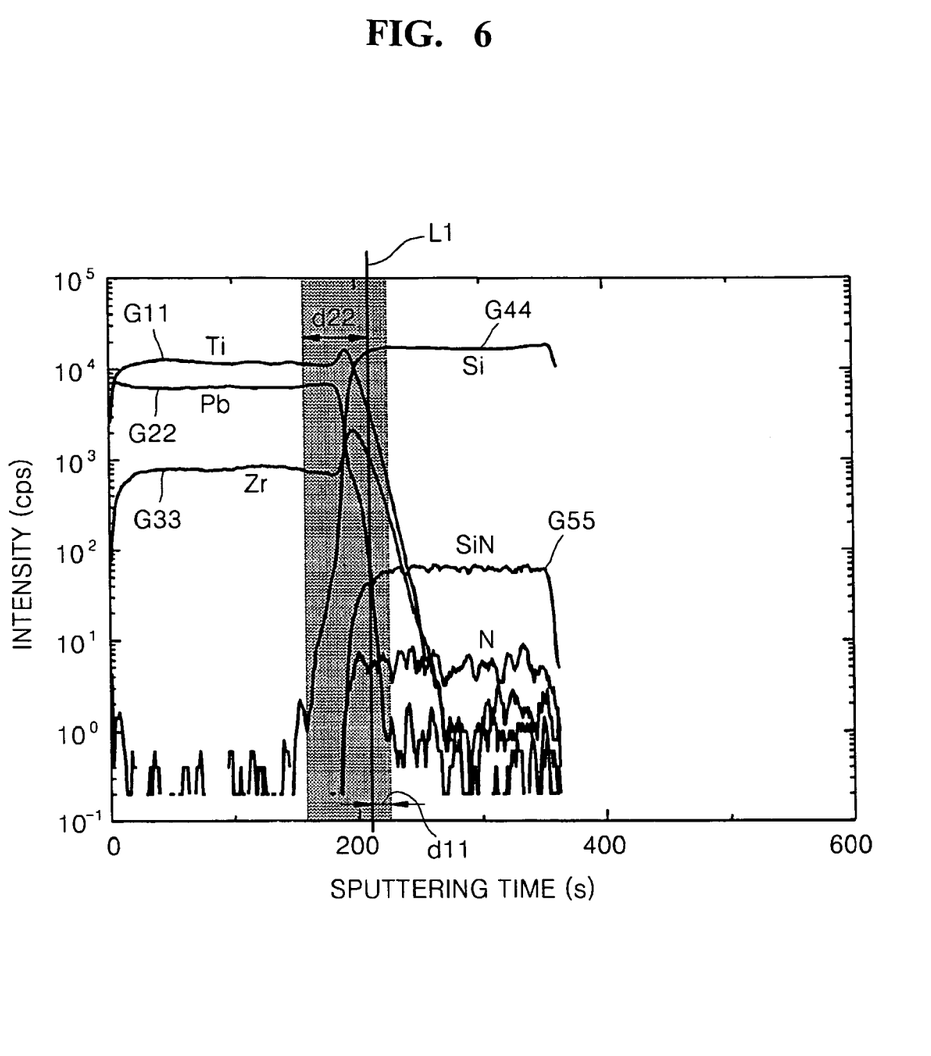
FIG. 6 is a graph illustrating SIMS data to examine a mutual diffusion extent of Pb and Si when a diffusion barrier layer is a SiN layer in a nonvolatile memory device according to example embodiments.
Figure 7:
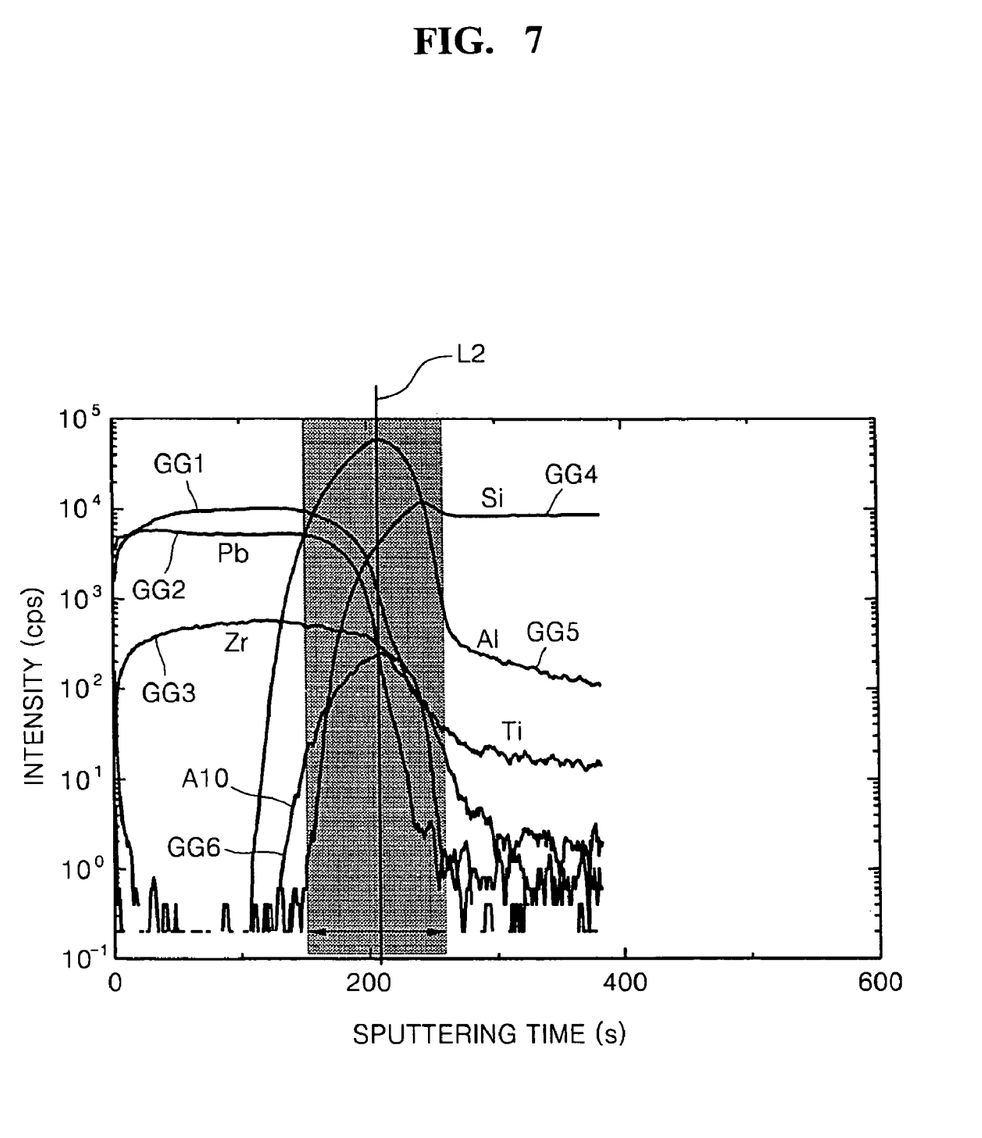
FIG. 7 is a graph illustrating SIMS data to examine a mutual diffusion extent of Pb and Si when a diffusion barrier layer is an $Al_2O_3$ layer in a nonvolatile memory device according to example embodiments.

Through the SIMS analysis, components of the materials existing between an upper surface of the stack structure (e.g., the upper surface of the PZT layer 58) and a bottom surface of the stack structure (e.g., the bottom surface of the second insulating interlayer) 52 may be analyzed. Through the component analysis, an amount of the material component diffused into the PZT layer 58 of the stack structure, for example, an amount of Si, may be determined, and an amount of Pb diffused into the second insulating interlayer 52 may be determined. In the SIMS analysis, thickness of the stack structure may become thinner as a sputtering time for the stack structure is increased. FIGS. 5-7 illustrate SIMS data for the stack structure.

FIG. 5 illustrates the extent that the Pb component of the PZT layer 58 and the Si component of the second insulating interlayer 52 may be diffused into each other when the stack structure does not include the diffusion barrier layer 54 and the second insulating interlayer 52 is a silicon dioxide (SiO$_2$) layer. For example, when the PZT layer 58 directly contacts the second insulating interlayer 52, there may be mutual diffusion of other components of the PZT layer 58 and the second insulating interlayer 52 into each other. Lines G1 through G5 of FIG. 5 are graphs respectively illustrating SIMS data of titanium (Ti), lead (Pb), zirconium (Zr), silicon (Si) and a silicon oxide (SiO) layer.

A vertical line L of FIG. 5 illustrates an interface of the PZT layer 58 and the second insulating interlayer 52. A left region of the vertical line L of FIG. 5 corresponds to the PZT layer 58, and a right region thereof corresponds to the second insulating interlayer 52. Further, d1 and d2 in FIG. 5 illustrate mutual diffusion lengths of Pb and Si respectively measured based on the vertical line L.

As illustrated in FIG. 5, when Pb in the PZT layer 58 and Si in the second insulating interlayer 52 are mutually diffused into each other relatively deeply, concentration of Pb in the PZT layer 58 may be decreased in accordance with the reaction of Pb and Si. As a result, the phase of the region of the PZT layer 58 into which Si is diffused may be changed from a perovskite structure to a pyrochlore structure. The region of the PZT layer 58 having a different structure from the perovskite structure does not show the same normal polarization characteristics as that in a perovskite structure. Furthermore, such a region may extend to a portion of the PZT layer 58 not directly contacting the second insulating interlayer 52. Because an effective area of the ferroelectric capacitor may become narrower, and even though the ferroelectric capacitor may be formed in a three dimensional shape similar to a trench structure, there may not be an increase effect of the effective area. However, when the diffusion barrier layer 54 is provided between the PZT layer 58 and the second insulating interlayer 52, the extent of mutual diffusion of Pb and Si may be negligible in comparison to FIG. 5.

FIGS. 6 and 7 illustrate mutual diffusion extents of Pb and Si in accordance with the type of diffusion barrier layer 54. FIG. 6 illustrates SIMS data when the diffusion barrier layer 54 is a SiN layer, and FIG. 7 illustrates SIMS data when the diffusion barrier layer 54 is an Al$_2$O$_3$ layer. Referring to FIG. 6, lines G11 through G55 are graphs illustrating SIMS data on titanium (Ti), lead (Pb), zirconium (Zr), silicon (Si) and a nitride (SiN) layer, respectively. A vertical line L1 illustrates an interface between the PZT layer and the diffusion barrier layer 54 composed of SiN. The left region of the vertical line L1 illustrates a region of the PZT layer 58, and the right region of the vertical line L1 illustrates regions of the diffusion barrier layer 54 and the second insulating interlayer 52. In comparing line G22, line G44, and line G55 of FIG. 6, intensity of lead (Pb) may drop relatively rapidly passing through the vertical line L1 from the left to the right, and an intensity of silicon (Si) may also drop relatively rapidly passing through the vertical line L1 from the right to the left. Intensity of the nitride (SiN) layer may also drop relatively rapidly passing through the vertical line L1 from the right to the left. In comparing FIGS. 5 and 6, mutual diffusion distances d11 and d22 of Pb and Si in FIG. 6 may be shorter than mutual diffusion distances d1 and d2 of Pb and Si in FIG. 5.

Referring to FIG. 7, lines GG1 through GG6 illustrate SIMS data on titanium (Ti), lead (Pb), zirconium (Zr), silicon (Si), aluminum (Al), and aluminum oxide (AlO) respectively. A vertical line L2 illustrates an interface of the PZT layer 58 and the diffusion barrier layer 54. A left region of the vertical line L2 corresponds to the PZT layer 58, and a right region thereof corresponds to the diffusion barrier layer 54 and the second insulating interlayer 52. Referring to line GG2 and line GG4 of FIG. 7, the intensity of Pb and Si may drop relatively rapidly passing through the vertical line L2. Mutual diffusion distances dd1 and dd2 of Pb and Si in FIG. 7 may be shorter than the mutual diffusion distances d1 and d2 of Pb and Si in FIG. 5.

From the result of FIG. 5 and the results of FIGS. 6 and 7, the mutual diffusion distances of Pb and Si, including the diffusion barrier layer 54 formed between the second insulating interlayer 52 and the PZT layer 58, may be shorter than the mutual diffusion distances when the diffusion barrier layer 54 is not formed therebetween.

Figure 8:
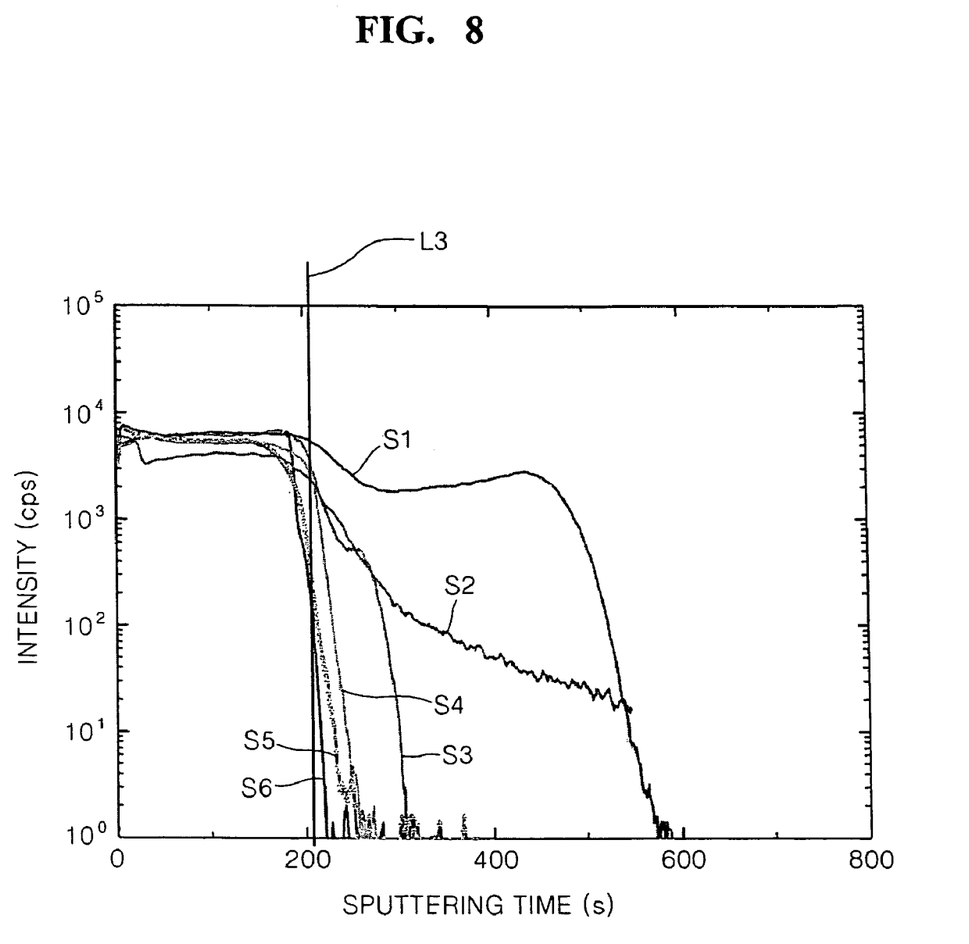
FIG. 8 is a graph illustrating SIMS data to examine a diffusion extent of Pb when a diffusion barrier layer is not provided, and a diffusion extent of Pb in accordance with kinds of a diffusion barrier layer when a diffusion barrier layer is provided in a nonvolatile memory device according to example embodiments.

FIG. 8 illustrates SIMS data of a diffusion of Pb in accordance with kinds of the diffusion barrier layer 54. Line S1 of FIG. 8 illustrates diffusion of Pb when a diffusion barrier layer is not disposed. Lines S2 through S6 respectively illustrate diffusion of Pb when the diffusion barrier layer 54 may be formed of a TiO$_2$ layer, a SiON layer, an Al$_2$O$_3$ layer with a thickness of about 200 Å, an Al$_2$O$_3$ layer with a thickness of about 100 Å, and a SiN layer, respectively. A vertical line L3 of FIG. 8 illustrates an interface between the PZT layer 58 and the diffusion barrier layer 54 in lines S2 through S6, and illustrates an interface between the PZT layer 58 and the second insulating interlayer 52 in line S1.

In comparing lines S1 through S6 of FIG. 8, the intensities of Pb may drop relatively rapidly when passing through the vertical line L3 in lines S3 through S6. The intensity of Pb may drop more rapidly when passing the interface between the PZT layer 58 and the diffusion barrier layer 54. The intensity of Pb may be decreased by sputtering in the case of line S2 when the diffusion barrier layer 54 is a $TiO_2$ layer. However, in the case of line S1 when the diffusion barrier layer 54 is not formed, the intensity of Pb may remain relatively high until a sputtering time is about 500 seconds.

Figure 9:
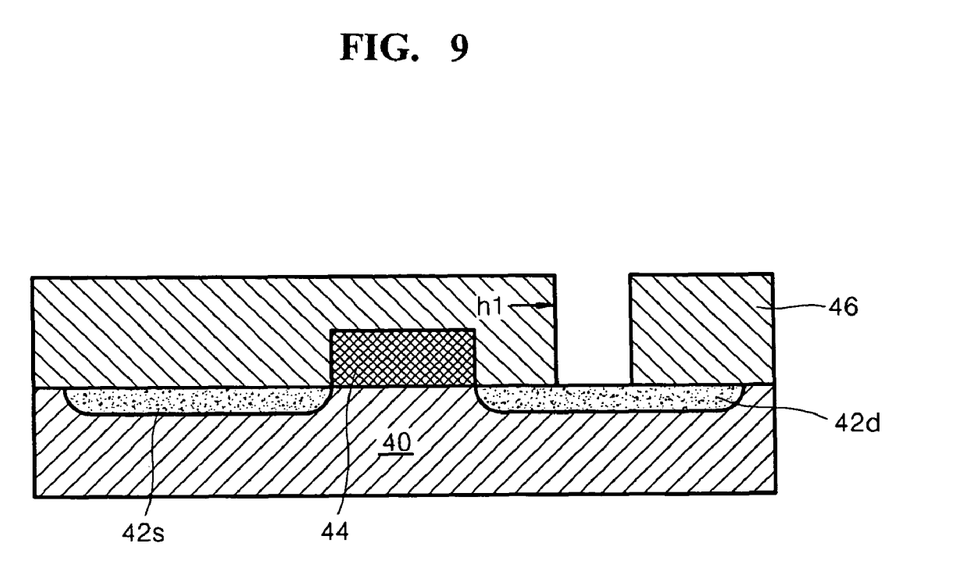
FIGS. 9-14 are diagrams illustrating a method of fabricating a memory device according to example embodiments in accordance with processing sequences.
Figure 10:
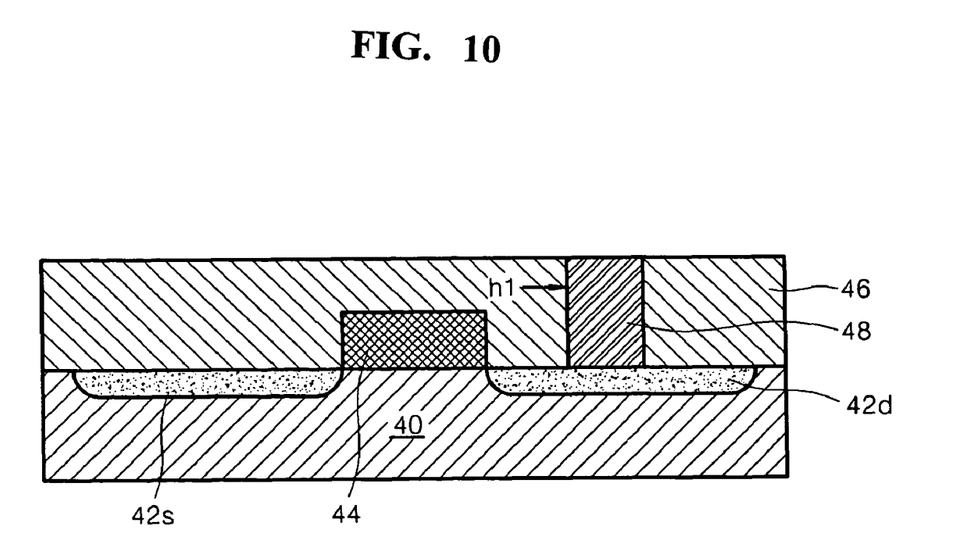

Referring to FIG. 9, a gate stack 44 may be formed on a given portion of a substrate 40. First and second impurity regions 42s and 42d may be formed in the substrate 40 using the gate stack 44 as a mask. The first and second impurity regions 42s and 42d may be formed by implanting impurities having a polarity opposite to that of doping impurities of the substrate 40. One of the first and second impurity regions 42s and 42d may be a source region, and the other one thereof may be a drain region. A field effect transistor functioning as a switching element may be formed in the substrate 40. After the field effect transistor is formed, a first insulating interlayer 46 covering the transistor may be formed on the substrate 40. A contact hole h1 exposing the second impurity region 42d may be formed in the first insulating interlayer 46 using typical photolithography and etch processes. The contact hole h1 may be filled with a conductive plug 48 as illustrated in FIG. 10. The conductive plug 48 may be composed of a material to form an ohmic contact with the second impurity region 42d, for example, doped polysilicon.

Figure 11:
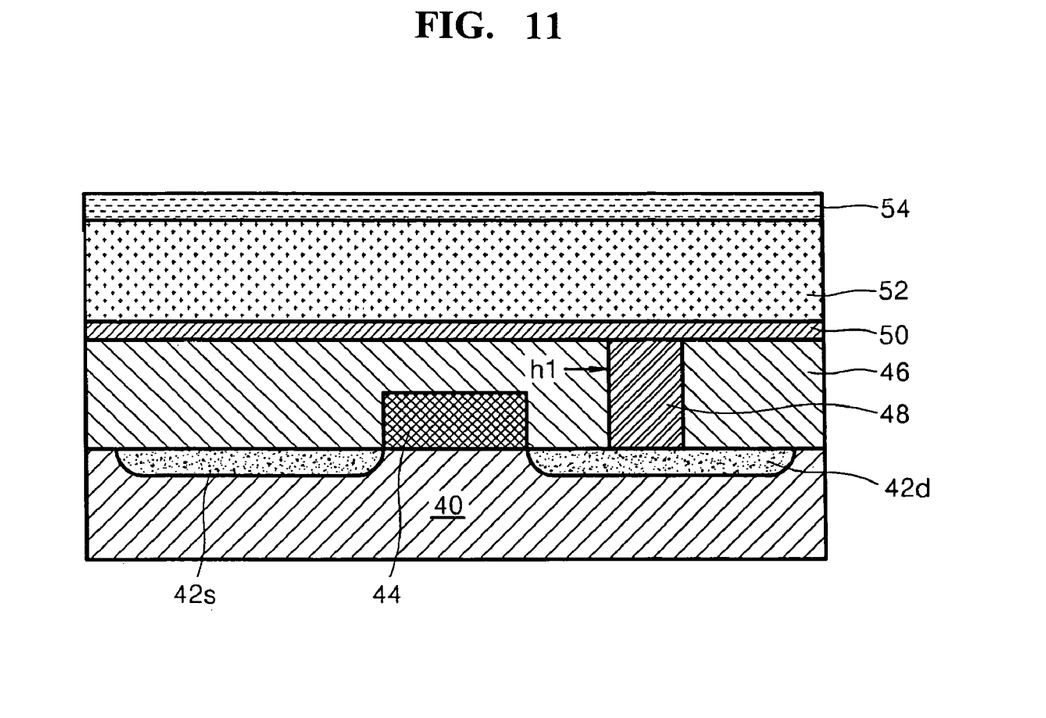

Referring to FIG. 11, an ohmic contact layer 50 covering an upper surface of the conductive plug 48 may be formed on the first insulating interlayer 46. The ohmic contact layer 50 may be formed of, for example, a TiAlN layer. The ohmic contact layer 50 may be formed of a single layer and/or a double layer. The ohmic contact layer 50 may be formed only on an upper surface of the conductive plug 48 as illustrated in FIG. 4. The formation of the ohmic contact layer 50 may be omitted when the conductive plug 48 makes an ohmic contact with a lower electrode 56 (FIG. 12) formed in a subsequent process.

After the ohmic contact layer 50 is formed, a second insulating interlayer 52 and a diffusion barrier layer 54 may be sequentially stacked on the ohmic contact layer 50. The second insulating interlayer 52 may be formed of $SiO_2$. Because the height of the lower electrode in a subsequent process is substantially determined by thickness of the second insulating interlayer 52, the second insulating interlayer 52 may be formed relatively thick in consideration of an appropriate height of the lower electrode. The second insulating interlayer 52 may be formed using a chemical vapor deposition (CVD) method, a sputtering method, and/or any other suitable deposition method. The diffusion barrier layer 54 may be formed of one layer selected from the group including a SiN layer, a SiON layer, an $Al_2O_3$ layer, and a $TiO_2$ layer. The diffusion barrier layer 54 may be formed of an insulating layer having a perovskite structure, and not including Pb, for example, a BST layer and/or a $LiNbO_3$ layer. The diffusion barrier layer 54 may be formed as a single layer, but may be formed of a double layer including first and second diffusion barrier layers. When the diffusion barrier layer 54 is formed of a double layer, the first diffusion barrier layer may be formed of one layer of the above group, and the second diffusion barrier layer may be formed of the insulating layer having a perovskite structure, and not including Pb. The diffusion barrier layer 54 may be formed using a CVD method, a sputtering method, and/or an atomic layer deposition (ALD) method.

The second insulating interlayer 52 may be formed of an insulating layer without $SiO_2$, for example, a SiN layer and/or an $Al_2O_3$ layer. Because the second insulating interlayer 52 does not include an element, which may be diffused out of the second insulating interlayer 52, it may not be necessary to form the diffusion barrier layer 54 on the second insulating interlayer 52. If there is a possibility that Pb may be diffused from a ferroelectric layer to be formed in a subsequent process (e.g., a PZT layer to the second insulating interlayer 52) and even though the second insulating interlayer 52 is formed of an insulating layer other than $SiO_2$, the diffusion barrier layer 54 may be formed on the second insulating interlayer 52 in order to prevent a diffusion of Pb.

Figure 12:
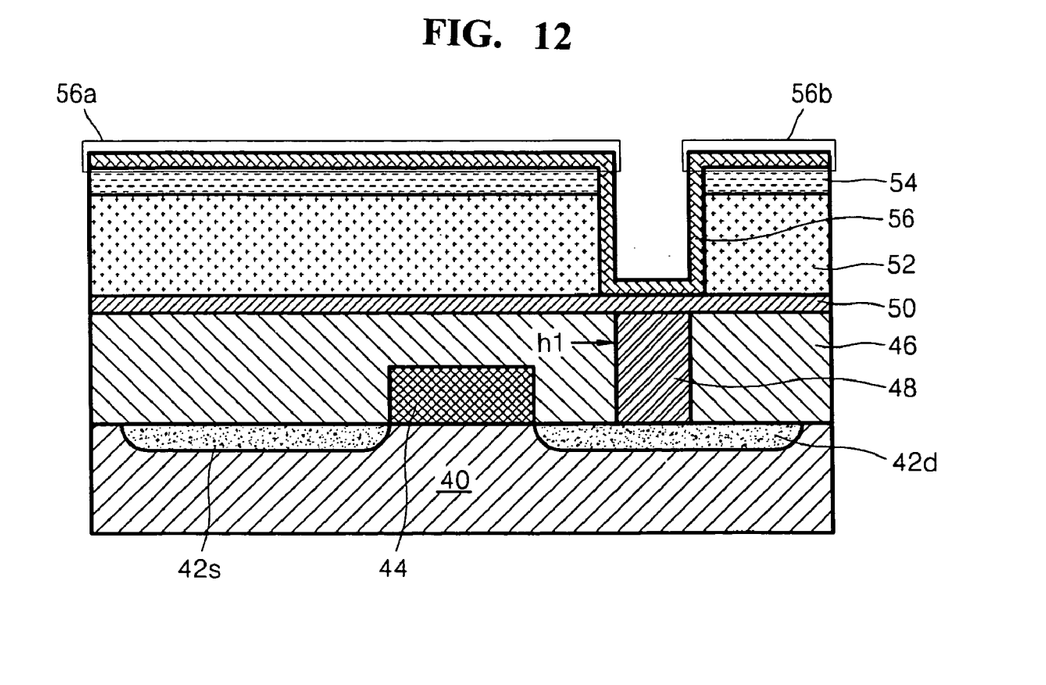

Referring to FIG. 12, a via hole v1 exposing the ohmic contact layer 50 may be formed in a stack structure including the second insulating interlayer 52 and the diffusion barrier layer 54. The via hole v1 may be formed over the conductive plug 48. After the via hole v1 is formed, a lower electrode 56 may be formed on the diffusion barrier layer 54 to cover a side surface and a bottom surface of the via hole v1. The lower electrode 56 may be composed of a given noble metal, for example, iridium (Ir).

Figure 13:
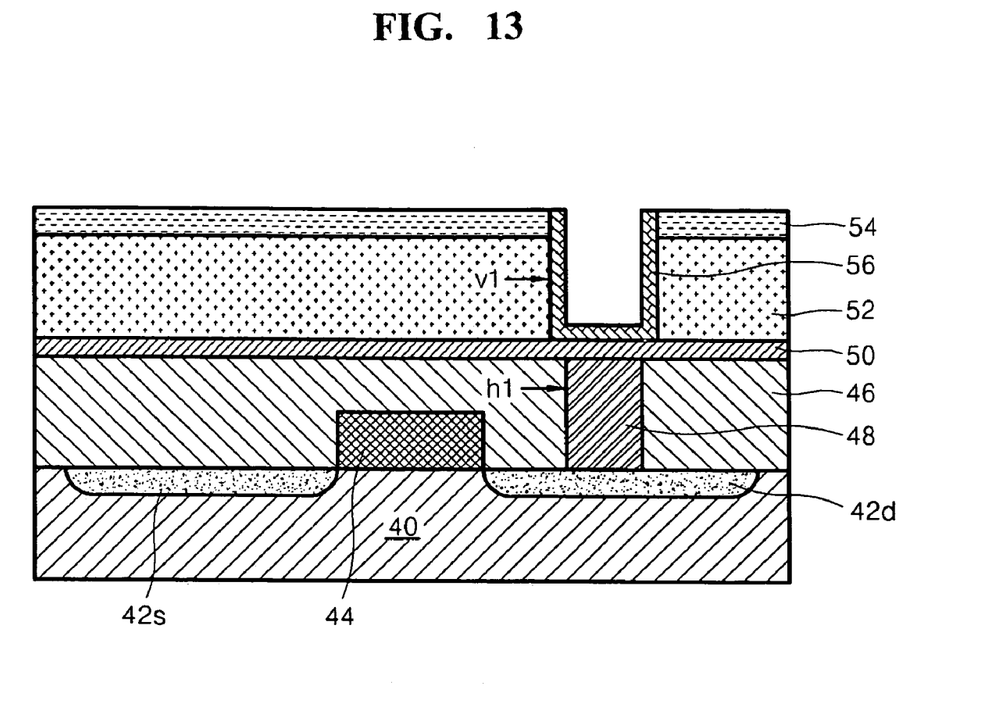

A polishing process may be performed for the lower electrode 56. The polishing process may be performed using a chemical mechanical polishing (CMP) method and/or an ion milling method. The polishing process may be performed until the diffusion barrier layer 54 is exposed. Portions 56a and 56b, formed on the upper surface of the diffusion barrier layer 54, may be removed, and thus, the lower electrode 56 may remain on the side surface and the bottom surface of the via hole v1 as illustrated in FIG. 13. The resulting structure of the lower electrode 56 may be a trench structure.

Figure 14:
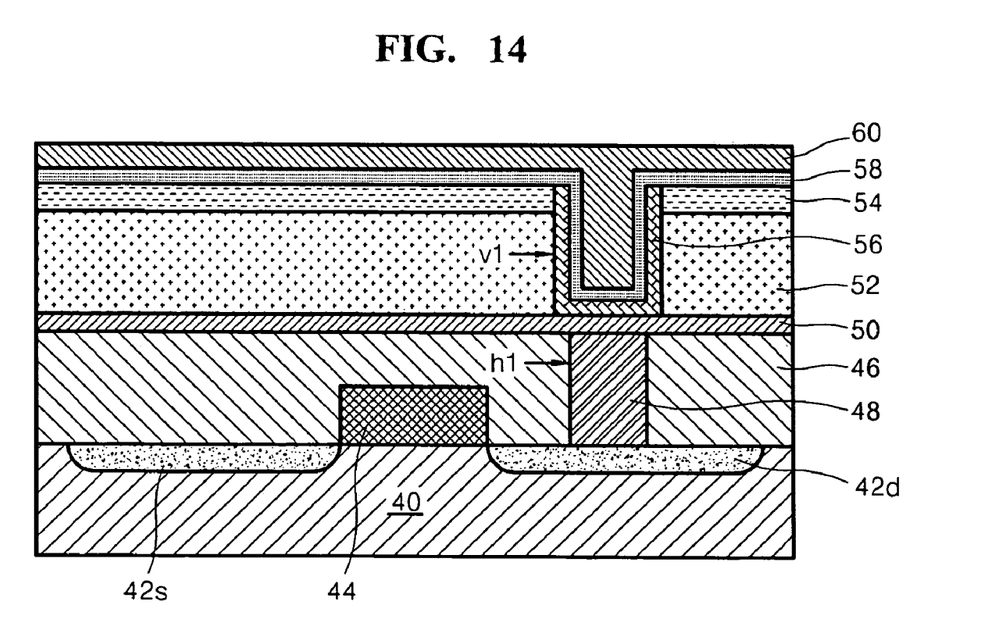

Referring to FIG. 14, a PZT layer 58, covering the exposed surface of the lower electrode 56 inside the via hole v1, may be formed on the diffusion barrier layer 54. The PZT layer 58 may be replaced with another ferroelectric layer. The PZT layer 58 may not directly contact the second insulating interlayer 52 because of the diffusion barrier layer 54. After the PZT layer 58 is formed, an upper electrode 60 may be formed on the PZT layer 58 to fill the via hole v1. The upper electrode 60 may be composed of the same noble metal as that of the lower electrode 56, but may also be composed of a different noble metal.

Many specific descriptions have been made, but these descriptions must be understood as example embodiments rather than defining the scope of the claims. For example, it is apparent to those skilled in the art that the ferroelectric capacitor may have a different three dimensional structure from the trench structure. The lower electrode may extend to a region around the via hole v1. After the lower electrode 56 and the PZT layer 58 are sequentially formed on the upper surface of the second insulating interlayer 52 without the diffusion barrier layer 54, the lower electrode 56 and the PZT layer 58 may be cut at a given distance from the via hole v1. An insulating layer spacer may be formed at the cut surface. The scope of example embodiments must be defined by the spirit of the following claims.

As described above, in the memory device of example embodiments, mutual diffusion of Pb and Si may be retarded or prevented by the presence of the diffusion barrier layer. Even though diffusion may occur, the extent of diffusion may be negligible. Pb concentration in the PZT layer may not be reduced due to the mutual diffusion and reaction of Pb and Si. The effective area between the PZT layer and the lower electrode may not be reduced, because a phase change of the PZT layer may be retarded or prevented. The ferroelectric capacitor of the memory device according to example embodiments may be ensured with a capacitance necessary for a normal operation of the memory device even though the memory device is more highly integrated. When the diffusion barrier layer is formed in the memory device according to example embodiments as described above, because the mutual diffusion of Pb and Si may not be a consequential factor, an instability problem with deposition of the PZT layer may be removed.

Because the via hole v1, on which the lower electrode will be formed, is formed after the second insulating interlayer and the diffusion barrier layer are sequentially stacked, the number of masks may not be increased even though the diffusion barrier layer is formed of a double layer or more.

While example embodiments have been particularly shown and described with reference to example embodiments thereof, it will be understood by those of ordinary skill in the art that various changes in form and details may be made therein without departing from the spirit and scope of the following claims.

What is claimed is:

1. A ferroelectric capacitor comprising:
   a single layer lower electrode having a U-shaped profile;
   an insulating interlayer around the single layer lower electrode;
   a ferroelectric layer on both the single layer lower electrode and the insulating interlayer around the single layer lower electrode and extending into a trench structure; and
   an upper electrode on the ferroelectric layer,
   wherein at least one diffusion barrier layer is between the insulating interlayer and the ferroelectric layer, the at least one diffusion barrier layer preventing mutual diffusion between lead (Pb) from the ferroelectric layer and silicon (Si) from the insulating interlayer, and
   wherein each of the insulating interlayer and the at least one diffusion barrier layer is in contact with a side of the single layer lower electrode, the at least one diffusion barrier layer being in direct contact with both the insulating interlayer and the ferroelectric layer.

2. The ferroelectric capacitor of claim 1, wherein the at least one diffusion barrier layer is composed of an insulating material excluding $SiO_2$.

3. The ferroelectric capacitor of claim 1, wherein the at least one diffusion barrier layer is at least one selected from the group consisting of a SiN layer, a $TiO_2$ layer, a SiON layer, and an $Al_2O_3$ layer.

4. The ferroelectric capacitor of claim 1, wherein the at least one diffusion barrier layer has a perovskite crystal structure and comprises a material that does not include Pb.

5. The ferroelectric capacitor of claim 1, wherein the at least one diffusion barrier layer includes first and second diffusion barrier layers.

6. The ferroelectric capacitor of claim 5, wherein the first diffusion barrier layer is one selected from the group consisting of a SiN layer, a $TiO_2$ layer, a SiON layer, and an $Al_2O_3$ layer.

7. The ferroelectric capacitor of claim 5, wherein the second diffusion barrier layer has a perovskite crystal structure and comprises a material that does not include Pb.

8. The ferroelectric capacitor of claim 5, wherein the second diffusion barrier layer is a BST ($BaSrTiO_3$) layer or a $LiNbO_3$ layer.

9. The ferroelectric capacitor of claim 1, wherein the ferroelectric layer is a PZT ($PbZrTiO_3$) layer.

10. A nonvolatile memory device comprising:
    a switching element on a substrate;
    the ferroelectric capacitor of claim 1; and
    a connecting element connecting the switching element and the ferroelectric capacitor via the single layer lower electrode.

11. The nonvolatile memory device of claim 10, further comprising:
    a second insulating interlayer covering the switching element;
    a contact hole exposing the switching element; and
    a conductive plug filling the contact hole.

12. The nonvolatile memory device of claim 11, further comprising:
    an ohmic contact layer covering the conductive plug.

13. The nonvolatile memory device of claim 12, wherein the ohmic contact layer extends onto the second insulating interlayer.

14. A method of fabricating a ferroelectric capacitor comprising:
    forming an insulating interlayer;
    forming a via hole in the insulating interlayer;
    forming a single layer lower electrode on a side surface and a bottom surface of the via hole, wherein the single layer lower electrode has a U-shaped profile;
    forming a ferroelectric layer covering the single layer lower electrode inside the via hole and on the insulating interlayer; and
    forming an upper electrode on the ferroelectric layer, wherein at least one diffusion barrier layer is between the insulating interlayer and the ferroelectric layer, the at least one diffusion barrier layer preventing mutual diffusion between lead (Pb) from the ferroelectric layer and silicon (Si) from the insulating interlayer, and
    wherein each of the insulating interlayer and the at least one diffusion barrier layer is in contact with a side of the single layer lower electrode, the at least one diffusion barrier layer being in direct contact with both the insulating interlayer and the ferroelectric layer.

15. A method of fabricating a nonvolatile memory device comprising:
    forming a switching element on a substrate;
    forming a ferroelectric capacitor according to claim 14;
    forming a connecting element connecting the switching element and the ferroelectric capacitor via the single layer lower electrode.

16. The method of claim 15, further comprising:
    forming an insulating interlayer to cover the switching element on the substrate;
    forming a contact hole exposing a drain region of the switching element in the insulating interlayer; and
    filling the contact hole with a conductive plug on the insulating interlayer.

17. The method of claim 16, wherein an ohmic contact layer covering the conductive plug is further formed between a first insulating interlayer and a second insulating interlayer, and the via hole is formed to expose the ohmic contact layer.

18. The method of claim 16, wherein an ohmic contact layer is further formed between the conductive plug and the single layer lower electrode.

19. The method of claim 14, wherein forming the single layer lower electrode includes forming the single layer lower electrode to extend between the ferroelectric layer and the at least one diffusion barrier layer at a desired length.

20. The method of claim 14, wherein the at least one diffusion barrier layer is one selected from the group consisting of a SiN layer, a TiO$_2$ layer, a SiON layer, and an Al$_2$O$_3$ layer.

21. The method of claim 14, wherein the at least one diffusion barrier layer is an insulating layer having a perovskite crystal structure excluding Pb.

22. The method of claim 14, wherein the at least one diffusion barrier layer includes first and second diffusion barrier layers.

23. The method of claim 22, wherein the first diffusion barrier layer is one selected from the group consisting of a SiN layer, a TiO$_2$ layer, a SiON layer, and an Al$_2$O$_3$ layer.

24. The method of claim 22, wherein the second diffusion barrier layer has a perovskite crystal structure excluding Pb.

25. The method of claim 14, wherein the ferroelectric layer is formed of a PZT layer.

26. The method of claim 14, wherein forming the single layer lower electrode further comprises: forming the single layer lower electrode covering the side surface and the bottom surface of the via hole on the at least one diffusion barrier layer; and polishing the single layer lower electrode until the at least one diffusion barrier layer is exposed.

* * * * *